(12) United States Patent
Kroneder

(10) Patent No.: US 7,242,584 B2
(45) Date of Patent: Jul. 10, 2007

(54) HOUSING FOR POWER SEMICONDUCTOR MODULES

(75) Inventor: Christian Kroneder, Schwanstetten (DE)

(73) Assignee: Semikron Elekronik GmbH & Co. KG, Nürnberg (DE)

( * ) Notice: Subject to any disclaimer, the term of this patent is extended or adjusted under 35 U.S.C. 154(b) by 647 days.

(21) Appl. No.: 10/736,378

(22) Filed: Dec. 15, 2003

(65) Prior Publication Data

US 2006/0126312 A1    Jun. 15, 2006

(30) Foreign Application Priority Data

Dec. 14, 2002  (DE) ................ 102 58 570

(51) Int. Cl.
  *H05K 5/00*  (2006.01)
  *H01L 23/02*  (2006.01)
(52) U.S. Cl. ............. 361/714; 257/678; 257/693; 439/76.1; 361/728; 361/752
(58) Field of Classification Search ........ 361/704, 361/707, 709–710, 715, 728, 730, 752, 774, 361/775; 257/678, 691–697; 439/76.1–76.2
See application file for complete search history.

(56) References Cited

U.S. PATENT DOCUMENTS

| | | | | |
|---|---|---|---|---|
| 4,218,724 A | * | 8/1980 | Kaufman | 361/736 |
| 4,449,165 A | * | 5/1984 | Kaufman | 361/723 |
| 4,630,174 A | * | 12/1986 | Kaufman | 361/713 |
| 5,625,536 A | * | 4/1997 | Soyano et al. | 361/736 |
| 5,761,040 A | * | 6/1998 | Iwasa et al. | 361/704 |
| 6,828,600 B2 | * | 12/2004 | Lenniger et al. | 257/181 |
| 6,995,461 B2 | * | 2/2006 | Soyano et al. | 257/678 |

FOREIGN PATENT DOCUMENTS

| | | |
|---|---|---|
| DE | 43 25 942 | 2/1995 |
| EP | 0 513 410 B1 | 5/1991 |
| EP | 0 513 410 | 11/1992 |
| EP | 0 750 345 | 12/1996 |
| JP | 07-153906 | * 6/1995 |

OTHER PUBLICATIONS

German Office Action dated Oct. 7, 2003 issued in corresponding application No. 102 58 570.9.
Translation of German Office Action dated Oct. 7, 2003 issued in corresponding application No. 102 58 570.9.

* cited by examiner

*Primary Examiner*—Michael Datskovsky
*Assistant Examiner*—Robert J. Hoffberg
(74) *Attorney, Agent, or Firm*—Cohen Pontani Lieberman & Pavane LLP

(57) ABSTRACT

A housing for power semiconductor modules with a base plate or for direct mounting on a heat sink. The housing (10) surrounds an electrically insulating substrate (40) with metal connection tracks (41) disposed thereon. The metal connection tracks are insulated from one another and have power semiconductor components (50) disposed on them. The housing has a cap (14) and at least one framelike housing part (12) forming the side walls thereof. This housing part (12) includes a main frame (120) and at least one locking frame (130). The main frame (120) has guides (122, 128) for receiving connection elements (30, 32). The locking frame (130) is disposed relative to the main frame (120) such that it rests at least in part on the connection tabs (310, 320) of the connection elements (30, 32), in order to prevent movemnt of the connection elements toward the substrate (40).

6 Claims, 3 Drawing Sheets

HOUSING FOR POWER SEMICONDUCTOR MODULES

BACKGROUND OF THE INVENTION

1. Field of the Invention

The present invention is directed to a housing for power semiconductor modules with a base plate or for direct mounting on a heat sink.

2. Description of the Related Art

Known power semiconductor modules comprise a housing with connection elements and a substrate with power semiconductor components disposed thereon and connected appropriately in terms of circuitry, such as thyristors and/or diodes, but also power transistors such as MOSFETs or insulated gate bipolar transistors (IGBTs) with recovery diodes connected antiparallel to them.

Modern power semiconductor modules of the kind known for instance from European Patent Disclosure EP 0 750 345 A2 are therefore the point of departure of the present invention. These power semiconductor modules, with particular attention to the components essential to this invention, comprise the following:

A base of the power semiconductor module that comprises either a base plate with a substrate disposed on it, or solely a substrate;

a substrate, which has connection tracks structured appropriately for the circuitry, on which tracks semiconductor components or other components are disposed;

an at least partly framelike housing, which surrounds the substrate and in which the connection elements are embedded, for electrically connecting the components or substrate to external supply lines; and a cap, as a top closure for the power semiconductor module.

Essentially, connection elements in power semiconductor modules have two different tasks: First, connecting the external load current supply lines to the power semiconductor components, and second, connecting external control and/or auxiliary terminals for controlling the power semiconductor components, for connecting to sensors inside the power semiconductor module, or for connecting to further components inside the power semiconductor module. Connection conductors for load currents preferably have screw connections to the external supply lines, while the external control and/or auxiliary terminals are preferably embodied as plug contacts. In the prior art, in the interior of the power semiconductor module, wire bond connections often form the electrical contact between the connection elements and the substrate connection tracks on which the components are disposed. For wire bond connection purposes, the connection elements preferably have partial surfaces that are preferably oriented parallel to the substrate but are not surrounded by the housing.

Such connection conductors are likewise disclosed in German Patent DE 43 25 942 C2, which proposes that the connection conductors be bent multiple times at an angle of less than 90° over their course inside the housing, for the sake of greater stability of the connection conductors, which are injected into the housing, to vibrations that occur in wire bonding.

It is a disadvantage of the prior art that in the references cited, the connection elements are injected into the housing. On the one hand, this means that for various configurations of connection elements, various different housings must be kept in inventory. Furthermore, the plastic shrinks during the cooling-down phase of its manufacture. As a result, the strength of the anchoring of the metal connection elements in the plastic is inadequate. Yet this strength is definitive for the quality of the wire bond connection between the partial face of the connection element and the connection tracks of the substrate, since the wire bonding, because of the vibration that is characteristic of it, requires stable supported surfaces.

SUMMARY OF THE INVENTION

One object of the present invention is to introduce a housing for power semiconductor modules in which the connection elements are permanently fixed in the housing, with minimal mobility toward and away from the substrate, and which can be flexibly equipped with connection elements.

The housing surrounds at least one electrically insulating substrate, with metal connection tracks disposed on the substrate and insulated from one another, and having power semiconductor components disposed on the connection tracks. This housing comprises a plurality of parts; at least one cap, and at least one framelike housing part that forms the side walls. This framelike housing part in turn comprises at least one main frame as well as at least one locking frame. The main frame has guides for receiving connection elements formed in or on the locking frame. The connection elements are associated with the substrate and have at least one partial face in the form of a connection tab extending parallel to the substrate. These connection tabs furthermore have at least one stop face which rests on abutments of the main frame to prevent movement of the connection element away from the substrate. At least one locking frame is disposed relative to the main frame in such a way that the locking frame rests at least partly on the connection tabs of the connection elements to prevent movement of the connection elements associated with the substrate.

Because of this embodiment of the housing of a power semiconductor module, it is assured regardless of the production process of the housing itself, that the connection elements are mechanically fixed and stable inside the housing. A further advantage of this inventive embodiment of the housing is that only those guides of the main frame that are also required for the particular circuit arrangement that is located on the substrate can be equipped with connection conductors. Thus, with a single housing, power semiconductor modules suitable for various different functions can be produced.

Another advantage is that the locking frame serves as bracing for the connection tabs. The connection tabs are partial faces of the connection conductors in the interior of the housing, at which faces the wire bond connections to the connection tracks of the substrate or the semiconductor components originate. This is advantageous because an opposing force is presented to the forces that act upon the connection tabs in the direction of the substrate while the wire bond connection is being made. Thus, the housing of the invention makes flexible design possible, while maintaining mechanical stability in terms of the position of the connection elements.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to

DETAILED DESCRIPTION OF THE PRESENTLY PREFERRED EMBODIMENTS

Figure 1:
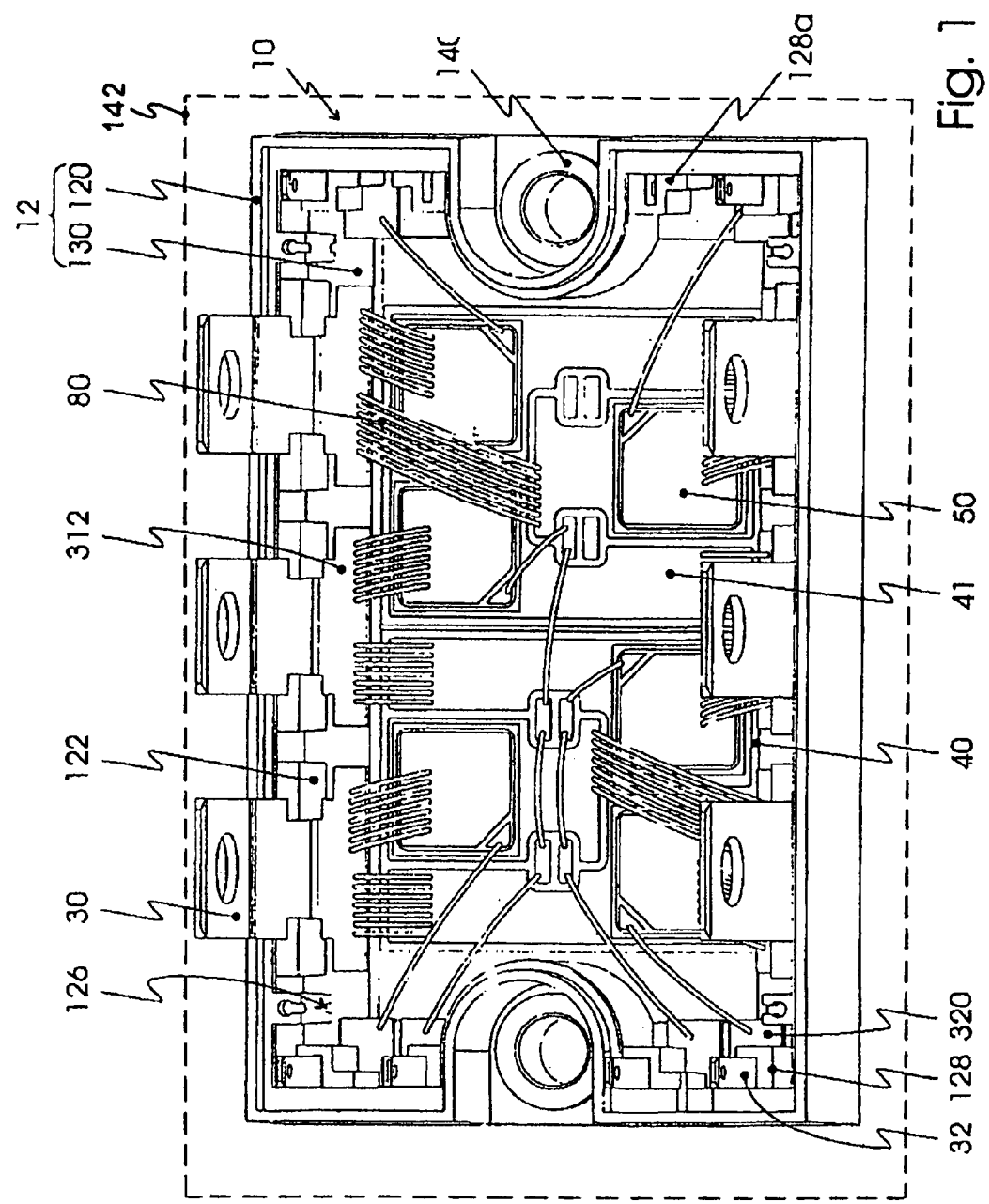
FIG. 1 shows a power semiconductor module with a housing according to the invention, in an oblique top view.

FIG. 1 shows a power semiconductor module with a housing according to the invention, in an oblique top view. The housing 10 surrounds two substrates 40, with metallized surfaces structured appropriately for the circuitry disposed on them. These surfaces act as connection tracks 41 and are connected by soldering to power semiconductor components 50 disposed on them. This power semiconductor component 50 also has wire bond connections 80, shown only in part for the sake of simplicity, for electrically connecting the power semiconductor components 50 and/or the connection tracks 41 to connection elements 30, 32. These connection elements serve to provide external connection for the power semiconductor module. To that end, the power semiconductor module has load connection elements 30 as well as auxiliary and control connection elements 32. The housing furthermore has two recesses 140 for screw connection to a heat sink 142 (shown in phantom in FIG. 1).

The housing 10 has a framelike part 12, which in turn comprises both a main frame 120 and two locking frames 130. The main frame 120 has guides 122, 128 for positioning the connection elements 30, 32. There are three guides 122 on each of the two long sides for the load connection elements 30, which on their end toward the substrate 40 each have a connection tab 310 for the disposition of bond wires 80 for connection to the power semiconductor components 50 and/or connection tracks 41. These connection tabs 310 rest on the locking frame 130, in order to assure a mechanically stable position of the connection tabs 310 during the production of the wire bond connections 80. Locking frame 130 is furthermore connected to associated recesses 126 of the main frame 120 by lugs and, like the main frame, rests on the base plate. In the circuit topology shown, all the guides 122 are equipped with load connections 30. In other circuit topologies, if they allow it, one or more of the guides 122 might not be so equipped.

On each of the two short sides of the housing 10 there are four guides 128 for auxiliary and control connection elements 32, which likewise on their end toward the substrate 40 each have one connection tab 320 for the disposition of bond wires 80 for connection to the power semiconductor components 50 and/or to the connection tracks 41. These connection tabs 320 likewise rest on the locking frame 130. In the circuit topology shown, six auxiliary and control connection elements are required, which means that two guides 128a are not equipped with auxiliary and control connection elements 32.

Figure 2:
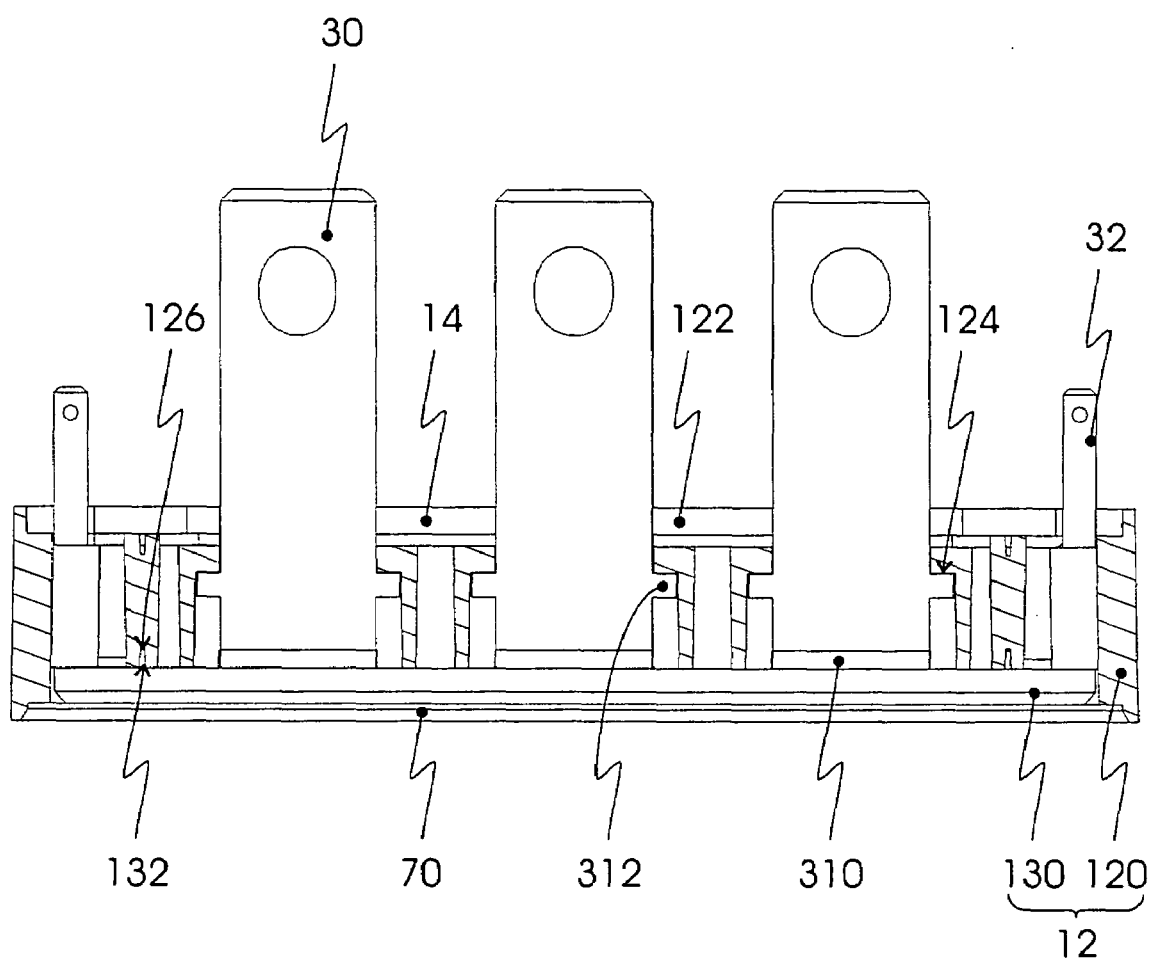
FIG. 2 is a section taken along the long side of the housing of the invention shown in FIG. 1.

FIG. 2 shows a section through the main frame along the long side of the housing of the invention shown in FIG. 1. The complete housing 10 is formed by the cap 14 and a framelike housing part 12, which in turn is formed of the main frame 120 and the locking frame 130. The lower closure of the power semiconductor module is formed by the base plate 70. The main frame 120 is partly disposed on the base plate 70 and partly projects beyond it, surrounding the base plate. The main frame 120 also has guides 122 for positioning the load connection elements 30. Abutments 124 are disposed in these guides, as stops for stop faces 312 of the load connection elements 30. It is thus assured that movement of the load connection elements toward the base plate and away from the substrate is prevented.

A locking frame 130 is also shown connected flush with the main frame 120 by means of lugs 132 disposed on the locking frame and associated recesses 126 of the main frame. Alternatively, the connection between the main frame 120 and the locking frame 130 can be accomplished by adhesive bonding.

The locking frame 130 likewise rests flush on the base plate 70. The connection tabs 310 of the load connection elements 30 rest on the side of the locking frame 130 opposite to the substrate or base plate 70 and thus prevents movement of the load connection elements 30 in the direction of the base plate 70 or substrate.

The auxiliary and control connection elements 32 are fixed analogously by means of both the main frame 120 and the locking frame 130.

Thus, by means of the connection of the main frame 120 with the locking frame 130, the housing 10 with connection elements 30, 32 disposed therein may be mounted to the base plate 70 despite mechanical stresses which may be imparted thereto during wire bonding.

Figure 3:
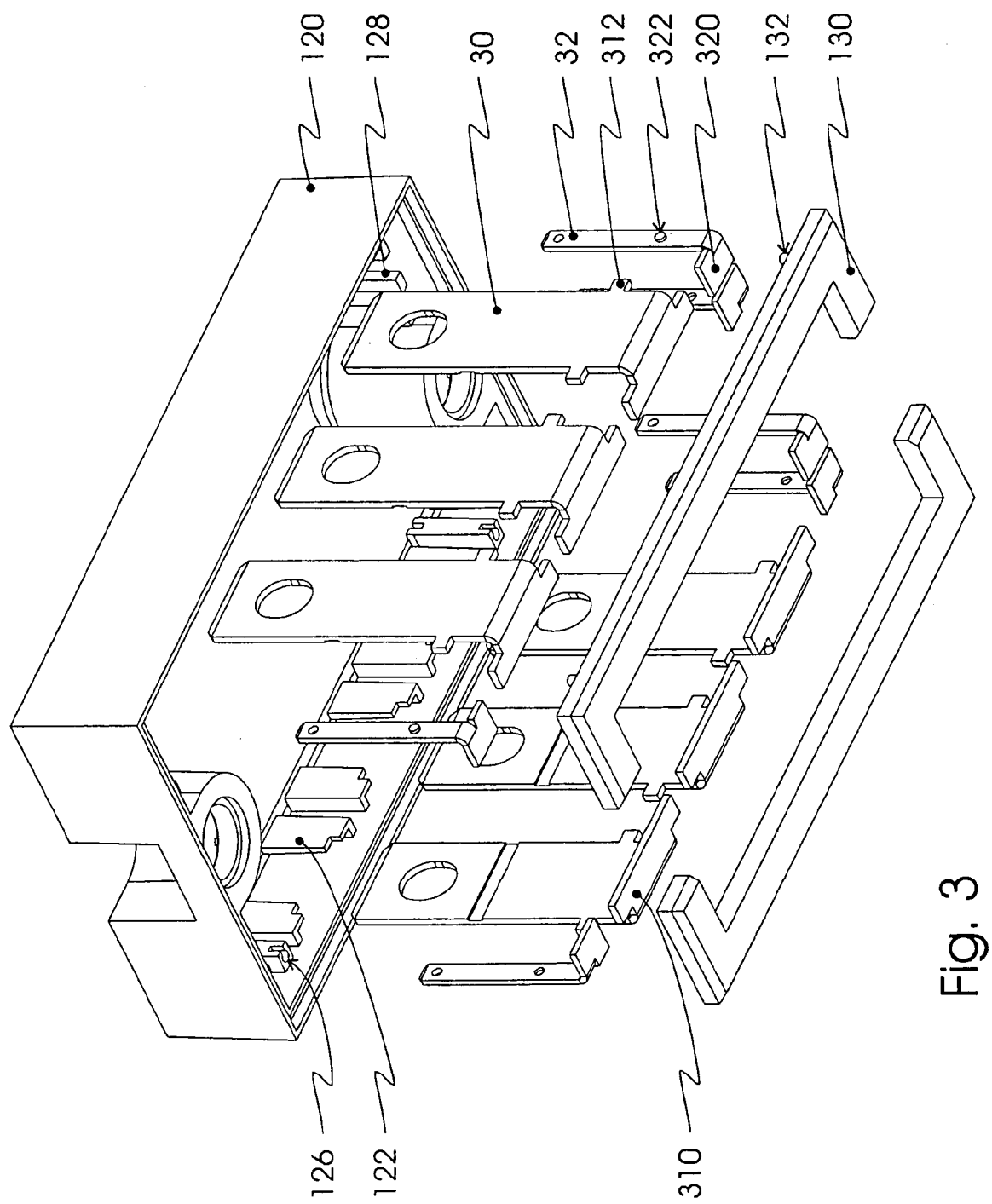
FIG. 3 is an exploded view of the housing of the invention in FIG. 1.

FIG. 3 shows an exploded view of the housing of the invention of FIG. 1. The main frame 120 is shown with guides 122, disposed in its interior, for load connection elements 30 and guides 128 for auxiliary and control connection elements 32. Abutments 124 are again provided inside the guides 30; they act as a stop for both stop faces 312 of the load connection elements 30 and, after assembly, effectively prevent movement of these connection elements in the direction away from the base plate. Analogously, the guides 128 of the auxiliary and control connection elements 32 likewise have abutments as a stop for the curved stop faces 322 of the auxiliary and control connection elements 32. As a result, movement of the auxiliary and control connection elements 32 in the direction away from the base plate is also effectively prevented.

Movement of all the connection elements 30, 32 in the direction of the base plate is effectively prevented by the two locking frames 130. These locking frames include lugs which latch into associated recesses 126. The movement is prevented by the fact that the connection tabs 310, 320 of all the connection elements rest flush on the side of the locking frames remote from the base plate.

Thus, while there have been shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A housing for power semiconductor modules with a base plate or for direct mounting on a heat sink, wherein said housing surrounds at least one electrically insulating substrate with metal connection tracks, insulated from one another, disposed on said substrate and with power semiconductor components also disposed on said substrate, said housing comprising:
    at least one cap and at least one framelike housing part forming side walls of said housing;
    wherein said housing part includes a main frame having an abutment and at least one guide for receiving a connection element, with at least one connection tab associated with said substrate, said connection element having at least one stop face, which rests on said abutment to prevent movement of said connection element in a direction away from said substrate; and
    at least one locking frame, disposed relative to said main frame so that said locking frame rests at least in part on said at least one connection tab to prevent movement of said connection element in a direction toward said substrate.

2. The housing of claim 1, wherein
said main frame is connected to said locking frame by means of lugs, disposed on said locking frame, and associated recesses disposed within said main frame.

3. The housing of claim 1, wherein
said main frame is connected to said locking frame by means of an adhesive connection.

4. The housing of claim 1, wherein
all elements of said housing comprise the same insulating plastic.

5. The housing of claim 1, wherein
said connection elements are selected from the group consisting of load connection elements and auxiliary/control connection elements.

6. The housing of claim 1, wherein
said substrate is disposed within said locking frame.

* * * * *